United States Patent
Yen et al.

(10) Patent No.: US 10,790,466 B2
(45) Date of Patent: Sep. 29, 2020

(54) IN-LINE SYSTEM FOR MASS PRODUCTION OF ORGANIC OPTOELECTRONIC DEVICE AND MANUFACTURING METHOD USING THE SAME SYSTEM

(71) Applicants: Feng-Wen Yen, Taipei (TW); Cheng-Hao Chang, Miaoli (TW)

(72) Inventors: Feng-Wen Yen, Taipei (TW); Cheng-Hao Chang, Miaoli (TW)

( * ) Notice: Subject to any disclaimer, the term of this patent is extended or adjusted under 35 U.S.C. 154(b) by 15 days.

(21) Appl. No.: 16/396,768

(22) Filed: Apr. 29, 2019

(65) Prior Publication Data

US 2020/0185636 A1  Jun. 11, 2020

(30) Foreign Application Priority Data

Dec. 11, 2018 (TW) .............................. 107144590 A

(51) Int. Cl.
*C30B 25/12* (2006.01)
*C23C 16/458* (2006.01)
*H01L 51/52* (2006.01)
*H01L 51/56* (2006.01)
*H01L 51/50* (2006.01)
(Continued)

(52) U.S. Cl.
CPC .......... *H01L 51/5203* (2013.01); *C23C 14/50* (2013.01); *C23C 16/4585* (2013.01); *C30B 25/12* (2013.01); *H01L 21/677* (2013.01); *H01L 21/67326* (2013.01); *H01L 21/67703* (2013.01); *H01L 21/67706* (2013.01); *H01L 21/67727* (2013.01); *H01L 21/67739* (2013.01); *H01L 21/67745* (2013.01); *H01L 51/5048* (2013.01); *H01L 51/56* (2013.01)

(58) Field of Classification Search
CPC ......... H01L 21/67326; H01L 21/67748; H01L 51/5203; H01L 51/5048; H01L 51/56; C30B 25/12; C23C 16/4585
USPC .......................................................... 257/40
See application file for complete search history.

(56) References Cited

U.S. PATENT DOCUMENTS 3,617,459 A * 11/1971 Logan .................... C23C 14/345
  204/192.23
5,851,299 A * 12/1998 Cheng ...................... C23C 16/04
  118/729
(Continued)

FOREIGN PATENT DOCUMENTS

JP  2013049592 A * 3/2013 ............. C30B 25/12
WO  WO-2014191623 A1 * 12/2014 ....... C23C 16/45544

OTHER PUBLICATIONS

Machine translation, Akamatsu, Japanese Pat. Pub. No. 2013-49592, translation date: Aug. 18, 2020, Espacenet, all pages. (Year: 2020).*

*Primary Examiner* — Victoria K. Hall

(57) ABSTRACT

An in-line system for mass production of an organic optoelectronic device is disclosed. The in-line system includes a patterned holder, a first chamber, and a second chamber. The patterned holder is for holding a substrate covered with a first electrode layer and a contact electrode layer, in which the first electrode layer and the contact electrode layer are partially shielded by the patterned holder. The first chamber is for forming an organic layer on portions of the first electrode layer and the contact electrode layer that are not shielded by the patterned holder. The second chamber is aligned with the first chamber and is for forming a second electrode layer on the organic layer.

20 Claims, 8 Drawing Sheets

(51) Int. Cl.
*H01L 21/677* (2006.01)
*H01L 21/673* (2006.01)
*C23C 14/50* (2006.01)

(56) References Cited

U.S. PATENT DOCUMENTS

| | | | | |
|---|---|---|---|---|
| 6,176,668 | B1* | 1/2001 | Kurita | H01L 21/67748 414/217 |
| 10,316,404 | B2* | 6/2019 | Yamazaki | C04B 35/44 |
| 2008/0099147 | A1* | 5/2008 | Myo | C23C 16/45574 156/345.34 |
| 2009/0067954 | A1* | 3/2009 | Lanee | H01L 21/68742 414/172 |
| 2009/0305441 | A1* | 12/2009 | Baccini | H01L 21/68764 438/16 |
| 2010/0089319 | A1* | 4/2010 | Sorensen | C23C 16/5096 118/723 E |
| 2010/0151680 | A1* | 6/2010 | Wang | H01L 21/67748 438/680 |
| 2012/0067274 | A1* | 3/2012 | Hara | C30B 25/08 117/88 |
| 2012/0247671 | A1* | 10/2012 | Sugawara | H01L 21/67346 156/345.31 |
| 2015/0107516 | A1* | 4/2015 | Tsunekawa | H01J 37/32458 118/719 |
| 2015/0207098 | A1* | 7/2015 | Yasuda | H01L 51/5092 257/40 |
| 2016/0181142 | A1* | 6/2016 | Raj | H01L 21/67017 156/345.3 |
| 2017/0323807 | A1* | 11/2017 | Kweon | H01L 21/67023 |
| 2018/0211858 | A1* | 7/2018 | Caveney | H01L 21/67742 |
| 2018/0277788 | A1* | 9/2018 | Huang | H01L 51/5228 |
| 2018/0331311 | A1* | 11/2018 | Chao | H01L 51/5203 |
| 2019/0035646 | A1* | 1/2019 | Nasman | C23C 16/52 |
| 2019/0062918 | A1* | 2/2019 | Shaikh | C23C 16/52 |
| 2019/0145001 | A1* | 5/2019 | Park | H01J 37/32082 118/723 R |
| 2019/0362990 | A1* | 11/2019 | Wang | H01L 21/68707 |
| 2019/0371635 | A1* | 12/2019 | Oori | H01L 21/67742 |
| 2020/0043759 | A1* | 2/2020 | Zhang | H01L 21/68785 |

* cited by examiner

IN-LINE SYSTEM FOR MASS PRODUCTION OF ORGANIC OPTOELECTRONIC DEVICE AND MANUFACTURING METHOD USING THE SAME SYSTEM

CROSS-REFERENCE TO RELATED APPLICATION

This application claims priority to Taiwan Application Serial Number 107144590, filed Dec. 11, 2018, which is herein incorporated by reference in its entirety.

BACKGROUND

Field of Invention

The present disclosure is related to an in-line system for mass production of an organic optoelectronic device and a method for manufacturing an organic optoelectronic device.

Description of Related Art

A light-emitting device such as an organic light-emitting diode (OLED) is formed by depositing organic materials and metal materials on a substrate. Conventionally, a cluster deposition apparatus is used to deposit various materials. As shown in FIG. 1, the cluster deposition apparatus 20 comprises a robot arm 710 and a plurality of vacuum chambers 720 radially disposed around the robot arm 710. The robot arm 710 is configured to load a substrate into the vacuum chamber 720 for depositing various materials on the substrate so as to produce a light-emitting device.

However, the use of the cluster deposition apparatus 20 or the similar apparatus for depositing various materials is time-consuming and costly. This is due to the fact that when the substrate is loaded in the vacuum chamber 720 for deposition of various materials, the deposited material in the vacuum chamber 720 and the corresponding mask must be replaced. In addition, it is necessary to wait until various materials have been deposited on the substrate before it can be moved out, and thereafter another substrate is sequentially loaded therein. Therefore, the topic of developing an apparatus which can effectively reduce the manufacturing hours and the production cost of LEDs has been studied by many groups.

SUMMARY

According to one aspect of the present disclosure, an in-line system for mass production of an organic optoelectronic device is provided. The in-line system for mass production comprises a patterned holder, a first chamber and a second chamber. The patterned holder is configured for holding a substrate, in which the substrate is covered with a first electrode layer and a contact electrode layer. The first electrode layer and the contact electrode layer are partially shielded by the patterned holder. The first chamber is configured for forming an organic layer on portions of the first electrode layer and the contact electrode layer that are not shielded by the patterned holder. The second chamber is aligned with the first chamber and is configured for forming a second electrode layer on the organic layer.

In an embodiment of the present disclosure, the first chamber may be a first vacuum evaporation chamber, and the second chamber may be a second vacuum evaporation chamber.

In an embodiment of the present disclosure, the patterned holder serves as a mask for partially shielding the first electrode layer and the contact electrode layer when the second electrode layer or the organic layer is formed, so that it is not necessary to replace with other masks.

In an embodiment of the present disclosure, the in-line system for mass production of organic optoelectronic device further comprises a first vacuum channel, in which the substrate is transported to the second chamber through the first vacuum channel to form the second electrode layer.

In an embodiment of the present disclosure, the in-line system for mass production of organic optoelectronic device further comprises a second vacuum channel and a laser source disposed in the second vacuum channel, in which the laser source is for forming an electrical connector electrically connecting the second electrode layer to the contact electrode layer.

In an embodiment of the present disclosure, the in-line system for mass production of organic optoelectronic device further comprises a third chamber aligned with the second chamber, in which the third chamber has a laser source disposed therein, and the third chamber is for forming an electrical connector electrically connecting the second electrode layer to the contact electrode layer.

In an embodiment of the present disclosure, the third chamber is a third vacuum evaporation chamber.

According to one embodiment of the present disclosure, the in-line system further comprises a transport unit for transporting the substrate from the first chamber to the second chamber.

According to one embodiment of the present disclosure, a length of the first vacuum channel is less than a length of the patterned holder along the direction.

According to one embodiment of the present disclosure, a length ratio of the first vacuum channel to the patterned holder ranges from 1:2 to 1:4 in the direction.

According to one embodiment of the present disclosure, the patterned holder comprises an opening exposing a portion of the substrate, and the organic layer and the second electrode layer have an identical shape corresponding to a shape of the opening.

According to one embodiment of the present disclosure, the first chamber and the second chamber each comprises a pumping component for vacuumizing the first chamber and the second chamber.

According to one embodiment of the present disclosure, the first chamber and the second chamber each comprises an inlet gate and an outlet gate configured to be closed when the first chamber and the second chamber is being vacuumized.

According to one embodiment of the present disclosure, the first chamber and the second chamber each comprises a control unit configured to control the duration of transporting the substrate.

According to one embodiment of the present disclosure, the in-line system further comprises a loading chamber coupled to the first chamber, in which the loading chamber has an outlet connected with the inlet of the first chamber, and the loading chamber is not in communication with the first chamber when the substrate is being loaded into the loading chamber.

According to one embodiment of the present disclosure, the in-line system further comprises a buffer chamber disposed between the loading chamber and the first chamber, in which the buffer chamber, the loading chamber and the first chamber are not in communication with each other when the buffer chamber is being vacuumized.

According to one embodiment of the present disclosure, the in-line system further comprises a laser processing chamber for forming a through hole penetrating the organic layer and the second electrode layer.

Another aspect of the present disclosure provides a method for producing an organic optoelectronic device by using the aforementioned in-line system. The method comprises transporting a substrate covered with a first electrode layer and a contact electrode layer; using the first chamber to form an organic layer on the first electrode layer and the contact electrode layer; and using the second chamber to form a second electrode layer on the organic layer.

In an embodiment of the present disclosure, the method for producing the organic optoelectronic device further comprises forming an electrical connector, which is for electrically connecting the second electrode layer to the contact electrode layer.

The above description will be described in detail in the following embodiments, and further explanation of the technical solutions of the present disclosure is provided.

DETAILED DESCRIPTION

In order to make the description of the present disclosure more detailed and complete, the following provides an illustrative description of embodiments and specific examples for the present disclosure. However, this is not the only form in which the specific embodiments of the present disclosure are implemented or utilized. The examples disclosed herein may be combined or substituted with each other in an advantageous manner, and other examples may be added to an example without the need of further explanation or description. In the following description, numerous specific details are described in detail to enable the reader to fully understand the examples. However, examples of the present disclosure may be practiced without these specific details.

Furthermore, spatially relative terms, such as "down," "under," "below," "on," "over," "above," etc., are for the convenience of describing one element or feature and the relationship with another element or feature. The true meaning of these spatially relative terms comprises other orientations. For example, when a pattern is flipped up and down by 180 degrees, the relationship between one element and another may change from "down," "under" or "below" to "on," "over" or "above." In addition, the spatially relative narratives used herein should be interpreted in the same way.

Figure 1:
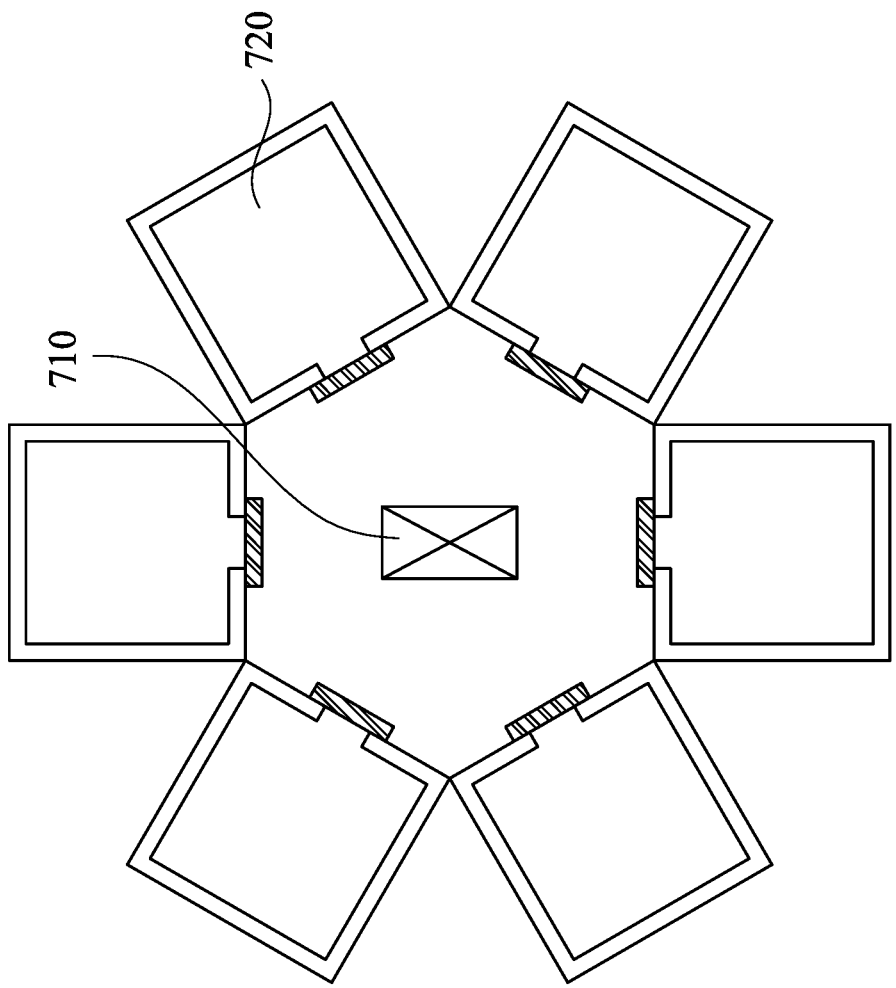
FIG. 1 is a schematic top plan view of a conventional cluster deposition apparatus.
Figure 2:
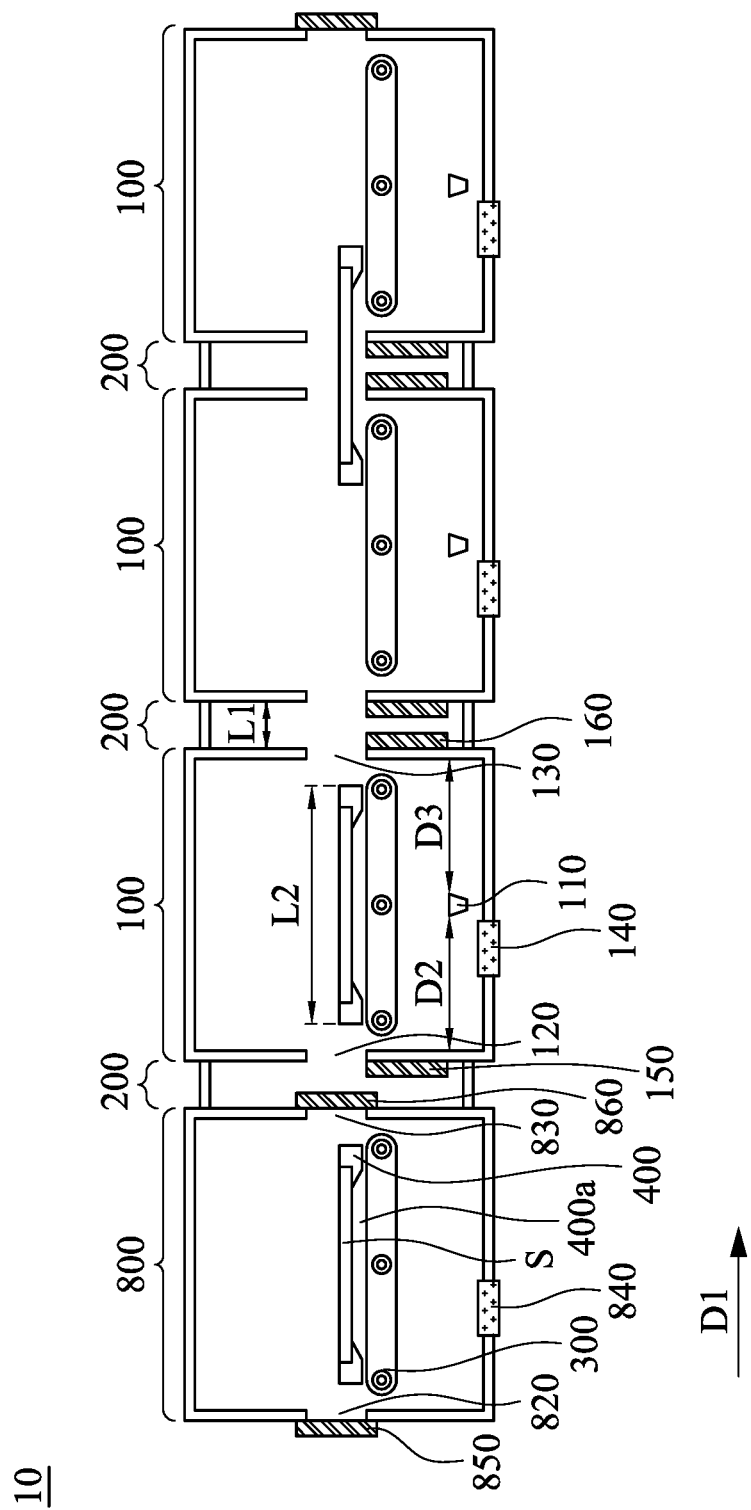
FIG. 2 is a schematic cross-sectional view showing an in-line system for mass production of an organic optoelectronic device according to a first embodiment of the present disclosure.

Reference is made to FIG. 2, which is a schematic cross-sectional view showing an in-line system for mass production of an organic optoelectronic device 10 according to a first embodiment of the present disclosure. The in-line system 10 for mass production of an organic optoelectronic device comprises a loading chamber 800, a plurality of vacuum evaporation chambers 100, a plurality of vacuum channels 200 and a transport unit 300. The in-line system for mass production of an organic optoelectronic device 10 can be used to continuously evaporate multiple layers of material on a substrate "S" to manufacture electronic or optoelectronic devices, such as solar cells, organic light-emitting diode devices and other electronic components.

In some embodiments, for example, the substrate "S" is a GaAs substrate, a germanium substrate or a silicon substrate, but other suitable substrates for the evaporation of organic materials or metal materials may be used.

The vacuum evaporation chambers 100 are configured to deposit a plurality of layers of material on the substrate "S". Specifically, each vacuum evaporation chamber 100 comprises an evaporation source 110, an inlet 120, an outlet 130, an inlet gate 150 at the inlet 120, and an outlet gate 160 at the outlet 130. The evaporation source 110 may be such as a heater capable of providing a stable deposition rate. According to need, various deposition materials are placed in each of the corresponding vacuum evaporation chambers 100. When the in-line system 10 for mass production of an organic optoelectronic device operates, each of the deposition materials may be heated to vaporization by the corresponding evaporation source 110 and adhered to a lower surface of the substrate "S", thereby forming a multilayer material thereon. The deposition material can be any material known in the art suitable for forming an electrode layer, an organic layer, or the like. As shown in FIG. 2, in some embodiments, the in-line system 10 for mass production of an organic optoelectronic device comprises three vacuum evaporation chambers 100, and the vacuum evaporation chambers 100 are for respectively depositing a first organic material layer, a second organic material layer and an electrode material layer on the lower surface of the substrate "S".

It should be noted that although only three vacuum evaporation chambers 100 are illustrated in FIG. 2, the in-line system 10 for mass production of an organic optoelectronic device may comprise more than three vacuum evaporation chambers 100 in other embodiments. For example, in the case where an organic layer of the light-emitting device to be formed is a multilayer structure (for example, the organic layer includes a hole injection layer (HIL), a hole transport layer (HTL), an emission layer (EML), an electron transport layer (ETL), an electron injection layer (EIL), or the like), the in-line system 10 for mass production of an organic optoelectronic device may comprise more than three vacuum evaporation chambers 100, and each vacuum evaporation chamber 100 is for evaporating a corresponding organic material layer on the substrate "S". In addition, an additional processing chamber, such as an etching chamber, may be inserted between adjacent ones of the vacuum evaporation chamber 100 if necessary.

In some embodiments, each vacuum evaporation chamber 100 comprises a pumping component 140. The pumping component 140 is coupled to a vacuum pumping device (not shown) for pumping out the gas in the vacuum evaporation chamber 100 (that is, the pumping component 140 is for vacuumizing the vacuum evaporation chamber 100). In some embodiments, in order to achieve a high degree of vacuum (e.g., $-10^{-7}$ torr), the inlet gate 150 and the outlet gate 160 of each vacuum evaporation chamber 100 are closed when pumping out the gas in the chamber 100 (that is, the inlet gate 150 and the outlet gate 160 of each vacuum evaporation chamber 100 are configured to be closed when the chamber 100 is being vacuumized).

In an embodiment, an outlet 830 of the loading chamber 800 and the inlet 120 of the vacuum evaporation chamber 100 adjacent thereto are connected by one of the vacuum channels 200. Moreover, two adjacent vacuum evaporation chambers 100 are connected by one of the vacuum channels 200.

It is noted that for each vacuum evaporation chamber 100, adjacent ones of the vacuum evaporation chambers 100 are communicated with each other through the vacuum channel 200 when the multilayer material is being deposited on the substrate "S" (i.e., the inlet gate 150 and the outlet gate 160 are open). In detail, a distance D2 between the evaporation source 110 of the vacuum evaporation chamber 100 and the inlet 120, as well as a distance D3 between the evaporation source 110 and the outlet 130 can be adjusted according to actual conditions. After the deposition material is heated to vaporization by the evaporation source 110, the deposition material in gaseous form only exists in the vacuum evaporation chamber 100. Accordingly, the gaseous deposition material does not diffuse to the adjacent vacuum channel 200 and the adjacent vacuum evaporation chamber 100, thereby preventing contamination. In addition, when the in-line system 10 for mass production of an organic optoelectronic device operates, the transport time of the substrate "S" can be reduced since it is not necessary to open and close the inlet gate 150 and the outlet gate 160, thereby reducing the manufacturing hours of the light-emitting device.

In some embodiments, the in-line system 10 for mass production of an organic optoelectronic device further comprises a patterned holder 400. The patterned holder 400 is configured for holding the substrate "S". As shown in FIG. 2, in an embodiment, the patterned holder 400 comprises an opening 400a exposing a portion of the substrate "S", and the multilayer material formed on the substrate "S" has an identical shape corresponding to a shape of the opening 400a. Specifically, a portion of the lower surface of the substrate "S" is shielded by the patterned holder 400 which serves as a mask, while another portion of the lower surface of the substrate "S" are exposed from the opening 400a. Therefore, the vaporized deposition material, which is heated by the evaporation source 110, adheres only to the exposed portion of the lower surface of the substrate "S".

The loading chamber 800 comprises an inlet 820, the abovementioned outlet 830, a pumping component 840, an inlet gate 850 at the inlet 820, and an outlet gate 860 at the outlet 830. The pumping component 840 is coupled to a vacuum pumping device (not shown) for vacuumizing the loading chamber 800 (such as pumping out the gas in the loading chamber 800 (that is, the pumping component 840 is for vacuumizing the loading chamber 800). Specifically, the outlet 830 of the loading chamber 800 is connected to the inlet 120 of the vacuum evaporation chamber 100 adjacent thereto.

It is understood that when the substrate "S" is loaded from the inlet 820 into the loading chamber 800, the loading chamber 800 is not in communication with the adjacent vacuum evaporation chamber 100 (i.e., the outlet gate 860 is closed). Accordingly, when the substrate "S" is being loaded in the loading chamber 800, the high vacuum of each vacuum evaporation chamber 100 is not affected. After the substrate "S" is loaded in the loading chamber 800, the inlet gate 850 is closed, and the gas in the loading chamber 800 is pumped out by a vacuum pumping device (not shown) to bring the loading chamber 800 to a high vacuum similar to that of each vacuum evaporation chamber 100. Subsequently, the outlet gate 860 is opened to transport the substrate "S" from the outlet 830 of the loading chamber 800 to the inlet 120 of the adjacent vacuum evaporation chamber 100. That is, by the configuration of the loading chamber 800, the substrate "S" can be loaded into the in-line system 10 for mass production of an organic optoelectronic device without affecting the high vacuum level of each vacuum evaporation chamber 100.

The transport unit 300 is located in the loading chamber 800 and each vacuum evaporation chamber 100. In an embodiment, the transport unit 300 may include transport rollers, conveyor rollers, or transport chains, but is not limited thereto. The corresponding transport unit 300 is configured to transport the substrate "S" from the inlet 820 of the loading chamber 800 to the outlet 830 and from the outlet 830 to the inlet 120 of the vacuum evaporation chamber 100 adjacent thereto through the vacuum channel 200 in a transporting direction D1. In addition, the transport unit 300 is configured to transport the substrate "S" from the inlet 120 of the vacuum evaporation chamber 100 to the outlet 130 and from the outlet 130 to the inlet 120 of the vacuum evaporation chamber 100 adjacent thereto through the vacuum channel 200 in the transporting direction D1.

As shown in FIG. 2, in an embodiment of the present disclosure, the transport unit 300 may be located only in each of the loading chamber 800 and the vacuum evaporation chambers 100, and not in any of the vacuum channels 200. In detail, in an embodiment, the ratio of a length L1 of each vacuum channel 200 to a length L2 of the patterned holder 400 in the transporting direction D1 is 1:2 to 1:4. In other words, the length L2 of the patterned holder 400 is greater than the length L1 of each vacuum channel 200, so that the patterned holder 400 can traverse the corresponding vacuum channel 200 from one of the transport units 300 located in a corresponding one of the vacuum evaporation chambers 100 to the transport unit 300 located in another one of the vacuum evaporation chambers 100. In addition, it is noted that although in FIG. 2, the transport unit 300 in one of the vacuum evaporation chambers 100 comprises only one patterned holder 400 (or one substrate "S"), the transport unit 300 in one of the vacuum evaporation chambers 100 may simultaneously comprise a plurality of patterned holders 400 (or a plurality of substrates S) in other embodiments. In other words, the transport unit 300 located in one of the vacuum evaporation chambers 100 can simultaneously transport a plurality of substrates "S" for simultaneous evaporation.

In some embodiments, the in-line system 10 for mass production of an organic optoelectronic device further comprises a control unit (not shown). The control unit is configured to control the duration of transporting the substrate "S", such as the duration at which the transport units 300 transports the substrate "S" from the inlet 120 of each vacuum evaporation chamber 100 to the outlet 130. Accordingly, the thickness of each layer formed on the substrate "S" is controlled by controlling the transport time of the substrate "S" in each of the vacuum evaporation chambers 100 (i.e., the time of deposition).

Figure 3:
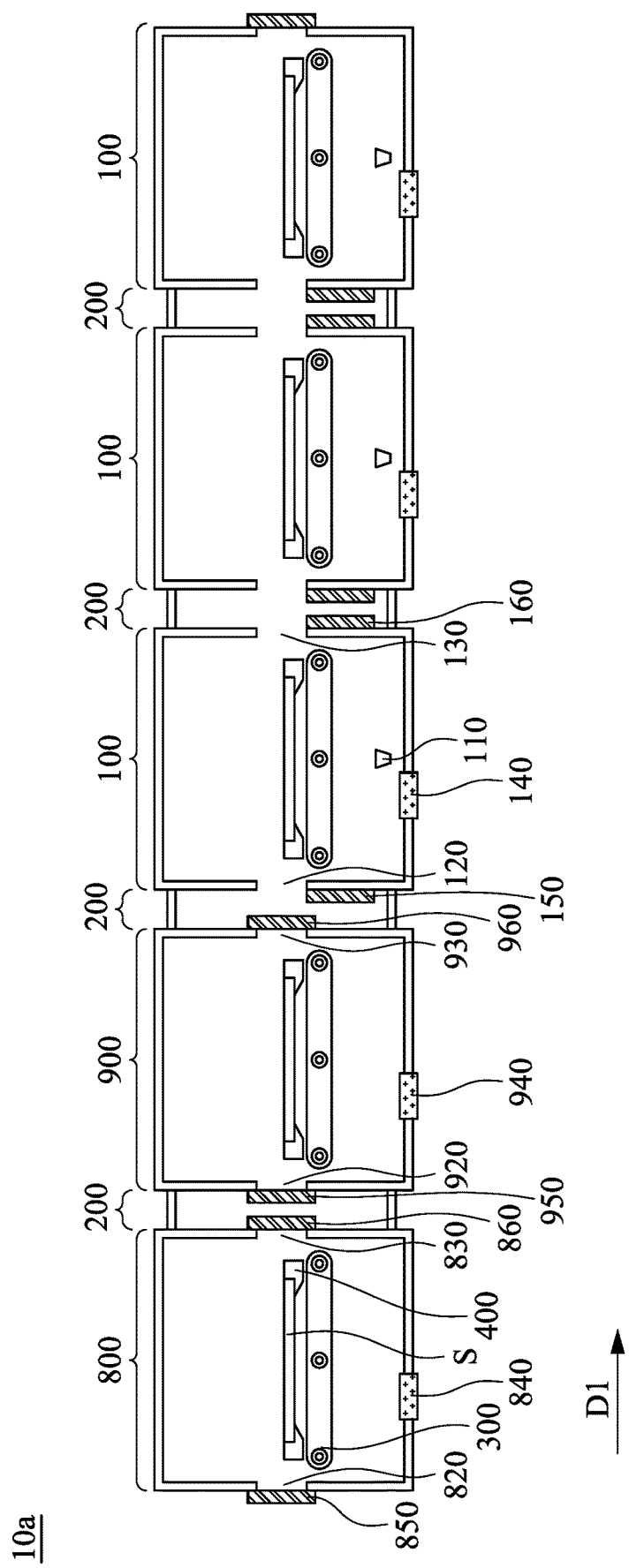
FIG. 3 is a schematic cross-sectional view showing an in-line system for mass production of an organic optoelectronic device according to a second embodiment of the present disclosure.

Reference is now made to FIG. 3, which is a schematic cross-sectional view showing an in-line system 10a for mass production of an organic optoelectronic device according to a second embodiment of the present disclosure. It is noted that in FIG. 3, the same or similar elements as those in FIG. 2 are given the same symbol and the related descriptions are omitted. The in-line system 10a for mass production of an organic optoelectronic device in FIG. 3 is similar to that in FIG. 2, with the difference being that the in-line system 10a for mass production of an organic optoelectronic device in FIG. 3 further comprises a buffer chamber 900. The buffer chamber 900 comprises an inlet 920, an outlet 930, a pumping portion 940, an inlet gate 950 at the inlet 920, and an outlet gate 960 at the outlet 830.

Specifically, the pumping portion 940 is coupled to a vacuum pumping device (not shown) to pump out the gas in the buffer chamber 900. The inlet 920 of the buffer chamber 900 is connected to the outlet 830 of the loading chamber 800, and the outlet 930 of the buffer chamber 900 is connected to the inlet 120 of the vacuum evaporation chamber 100 adjacent thereto. In other words, the buffer chamber 900 is disposed between the loading chamber 800 and the vacuum evaporation chamber 100. Moreover, one of the transport units 300 is located in the buffer chamber 900, and the transport unit 300 is configured to transport the substrate "S" from the outlet 830 of the loading chamber 800 through the corresponding vacuum channel 200 to the inlet 920 of the buffer chamber 900 in the transporting direction D1. In addition, the transport unit 300 is configured to transport the substrate "S" from the inlet 920 of the buffer chamber 900 to the outlet 930 in the transporting direction D1, and from the outlet 930 through the vacuum channel 200 to the inlet 120 of the vacuum evaporation chamber 100 adjacent thereto.

It is understood that the buffer chamber 900 is configured so that when the substrate "S" enters the buffer chamber 900 and the gas in the buffer chamber 900 is pumped out (i.e., the buffer chamber 900 is being vacuumized), the buffer chamber 900 is not in communication with the loading chamber 800 and any of the vacuum evaporation chambers 100. In detail, in order to feed the substrate "S" quickly into each vacuum evaporation chamber 100 without affecting the high vacuum level of each vacuum evaporation chamber 100, the buffer chamber 900 is used to quickly achieve a high vacuum, and the substrate "S" can be fed into each vacuum evaporation chamber 100 more quickly.

In more detail, when the buffer chamber 900 is not present (such as in the case of the in-line system 10 for mass production of an organic optoelectronic device shown in FIG. 2), in order to transport the substrate "S" from the loading chamber 800 to the adjacent vacuum evaporation chamber 100, it is necessary to pump out the gas in the loading chamber 800 to achieve a high vacuum level similar to that of the vacuum evaporation chamber 100. However, when the inlet 820 of the loading chamber 800 is opened for loading the substrate "S", the loading chamber 800 is in a normal pressure state. Since it is time-consuming to pump out the gas from the normal pressure state to achieve a high vacuum, a first vacuum level can be reached first in the loading chamber 800 by the setting of the buffer chamber 900, and a second vacuum level similar to that in the vacuum evaporation chamber 100 can be reached in the buffer chamber 900. For example, the vacuum level in each vacuum evaporation chamber 100 is about $10^{-7}$ torr. After the substrate S is placed in the loading chamber 800, the inlet gate 850 and the outlet gate 860 of the loading chamber 800 are closed, and the gas in the loading chamber 800 is pumped out to achieve a vacuum level of about $10^{-2}$ torr. Next, the outlet gate 860 of the loading chamber 800 is opened to transport the substrate "S" into the buffer chamber 900 (at this time, the outlet gate 960 of the buffer chamber 900 is closed). Subsequently, the inlet gate 950 of the buffer chamber 900 is closed, and the gas in the buffer chamber 900 is pumped out to achieve a vacuum level of about $10^{-6}$ torr.

Figure 4:
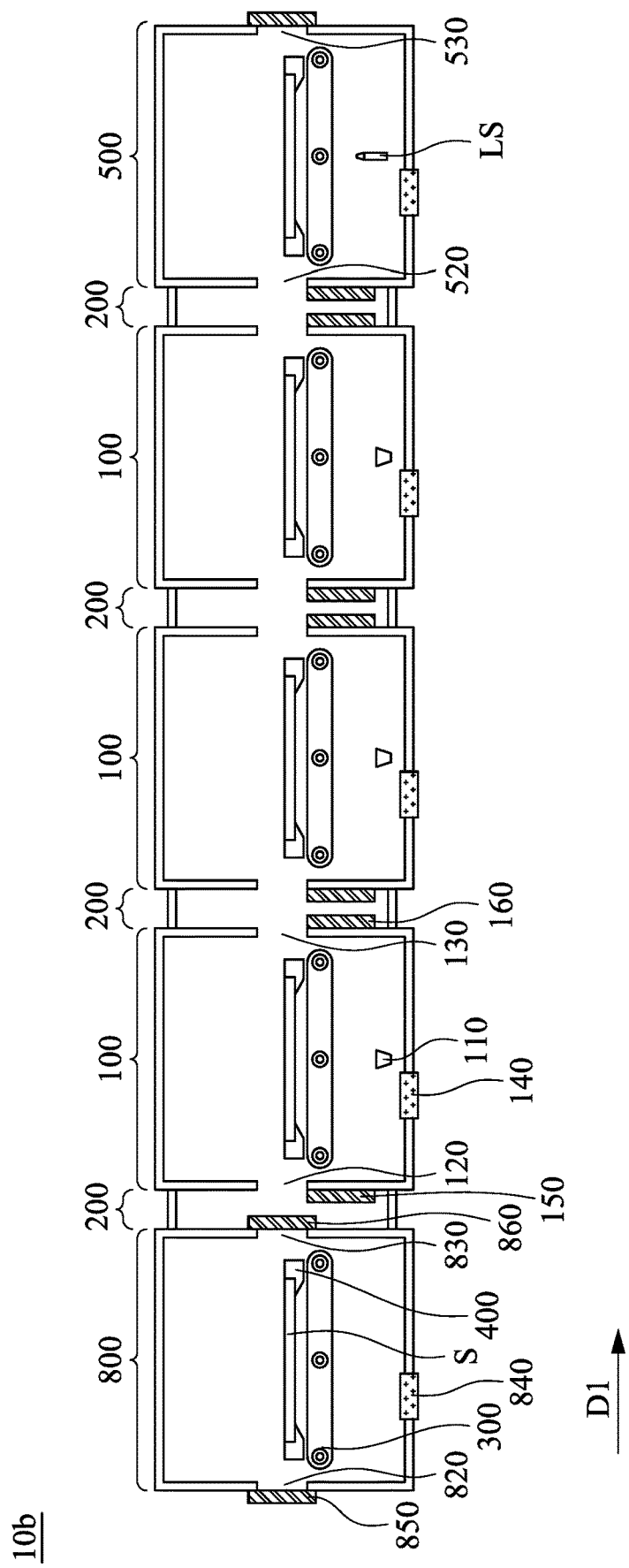
FIG. 4 is a schematic cross-sectional view showing an in-line system for mass production of an organic optoelectronic device according to a third embodiment of the present disclosure.

Reference is made to FIG. 4, which is a schematic cross-sectional view showing an in-line system 10b for mass production of an organic optoelectronic device according to a third embodiment of the present disclosure. It is noted that in FIG. 4, the same or similar elements as those in FIG. 2 are given the same symbol and the related descriptions are omitted. The in-line system 10b for mass production of an organic optoelectronic device in FIG. 4 is similar to that in FIG. 2, with the difference being that the in-line system 10b for mass production of an organic optoelectronic device in FIG. 4 further comprises a laser processing chamber 500.

The laser processing chamber 500 comprises a laser source "LS", an inlet 520, and an outlet 530. The inlet 520 of the laser processing chamber 500 is connected to the outlet 530 of one of the vacuum evaporation chambers 100 through a vacuum channel 200. The laser source "LS" is configured for forming a through hole penetrating a layer or a plurality of layers of material formed on the substrate "S" by emitting a laser.

Figure 5:
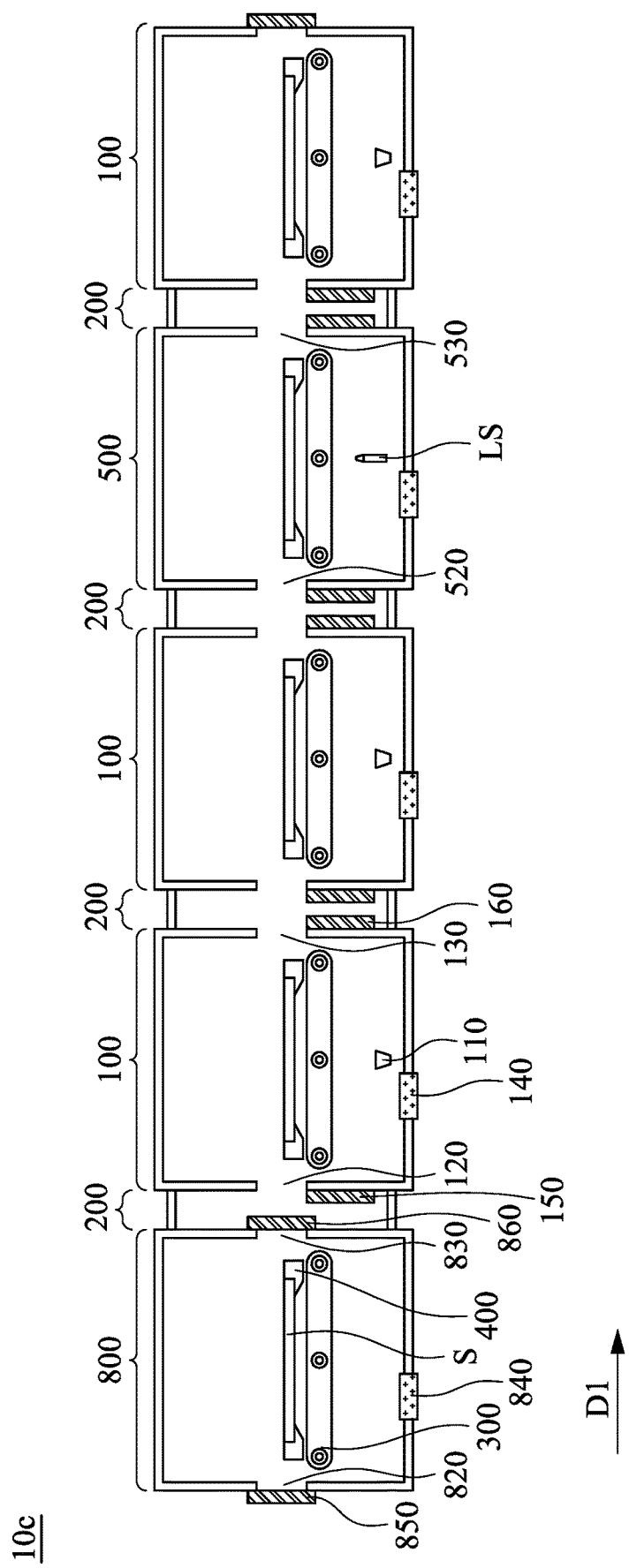
FIG. 5 is a schematic cross-sectional view showing an in-line system for mass production of an organic optoelectronic device according to a fourth embodiment of the present disclosure.

FIG. 5 is a schematic cross-sectional view showing an in-line system 10c for mass production of an organic optoelectronic device according to a fourth embodiment of the present disclosure. Referring to FIG. 5, the in-line system 10c for mass production of an organic optoelectronic device in FIG. 5 is similar to that in FIG. 4, with the difference being that the laser processing chamber 500 of the in-line system for mass production of an organic optoelectronic device 10c is disposed between two vacuum evaporation chambers 100. Accordingly, after penetrating one or more layers of material by the laser, other material layers may be deposited in the next vacuum evaporation chamber 100.

Figure 6:
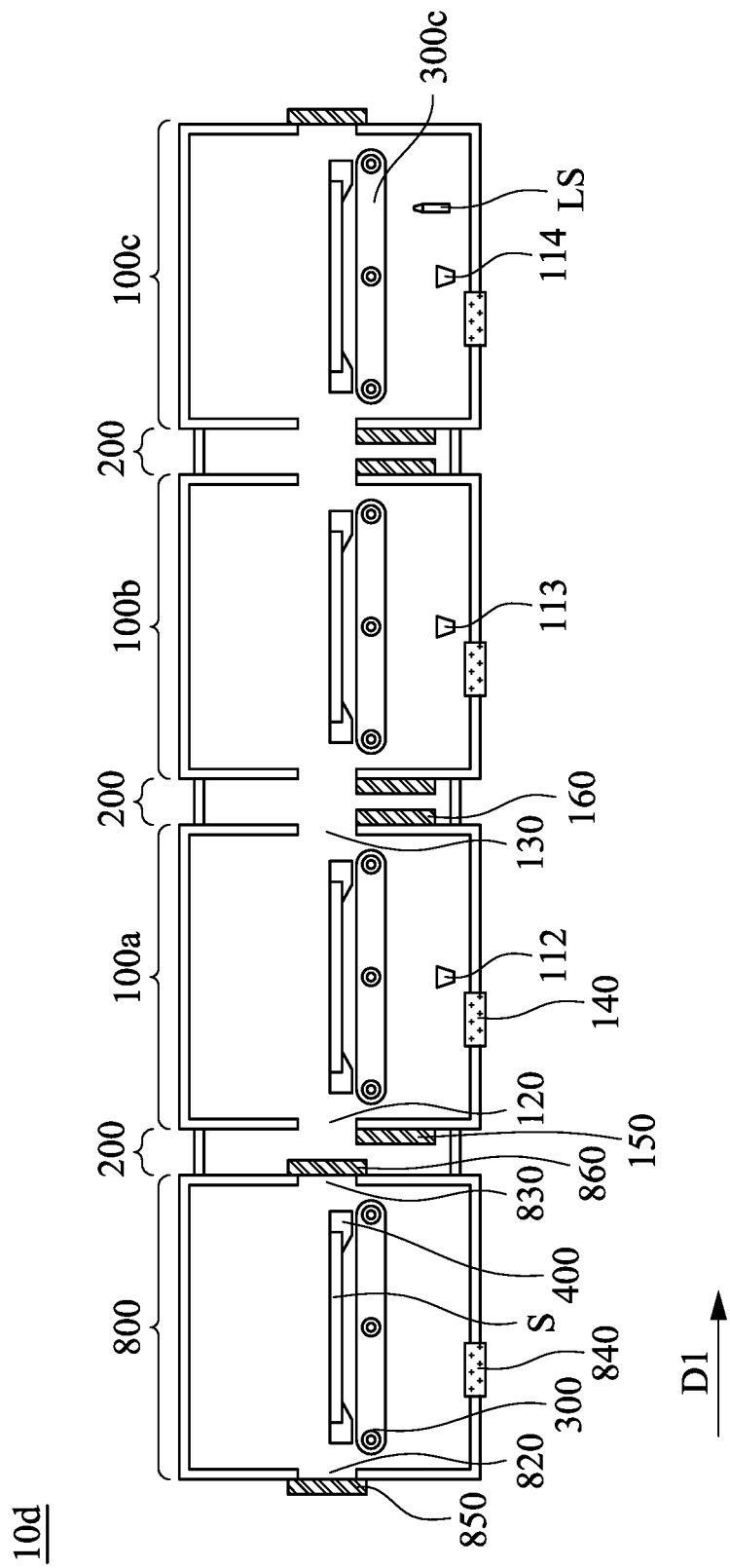
FIG. 6 is a schematic cross-sectional view showing an in-line system for mass production of an organic optoelectronic device according to a fifth embodiment of the present disclosure.

Reference is now made to FIG. 6, which is a schematic cross-sectional view showing an in-line system 10d for mass production of an organic optoelectronic device according to a fifth embodiment of the present disclosure. The in-line system 10d for mass production of an organic optoelectronic device in FIG. 6 is similar to that in FIG. 2, and one of the differences is that in the in-line system for mass production of an organic optoelectronic device 10d in FIG. 6, the vacuum evaporation chambers comprise a first evaporation chamber 100a having a first evaporation source 112 disposed therein, a second evaporation chamber 100b having a second evaporation source 113 disposed therein, a third evaporation chamber 100c having a third evaporation source 114 disposed therein, and a laser source "LS" disposed in the third vacuum evaporation chamber 100c. That is, in some embodiments, the laser source "LS" can be directly disposed in one of the vacuum evaporation chambers (i.e., the third vacuum evaporation chamber 100c in this embodiment) to emit a laser to penetrate a layer or a plurality of layers of material formed on the substrate "S".

Figure 7:
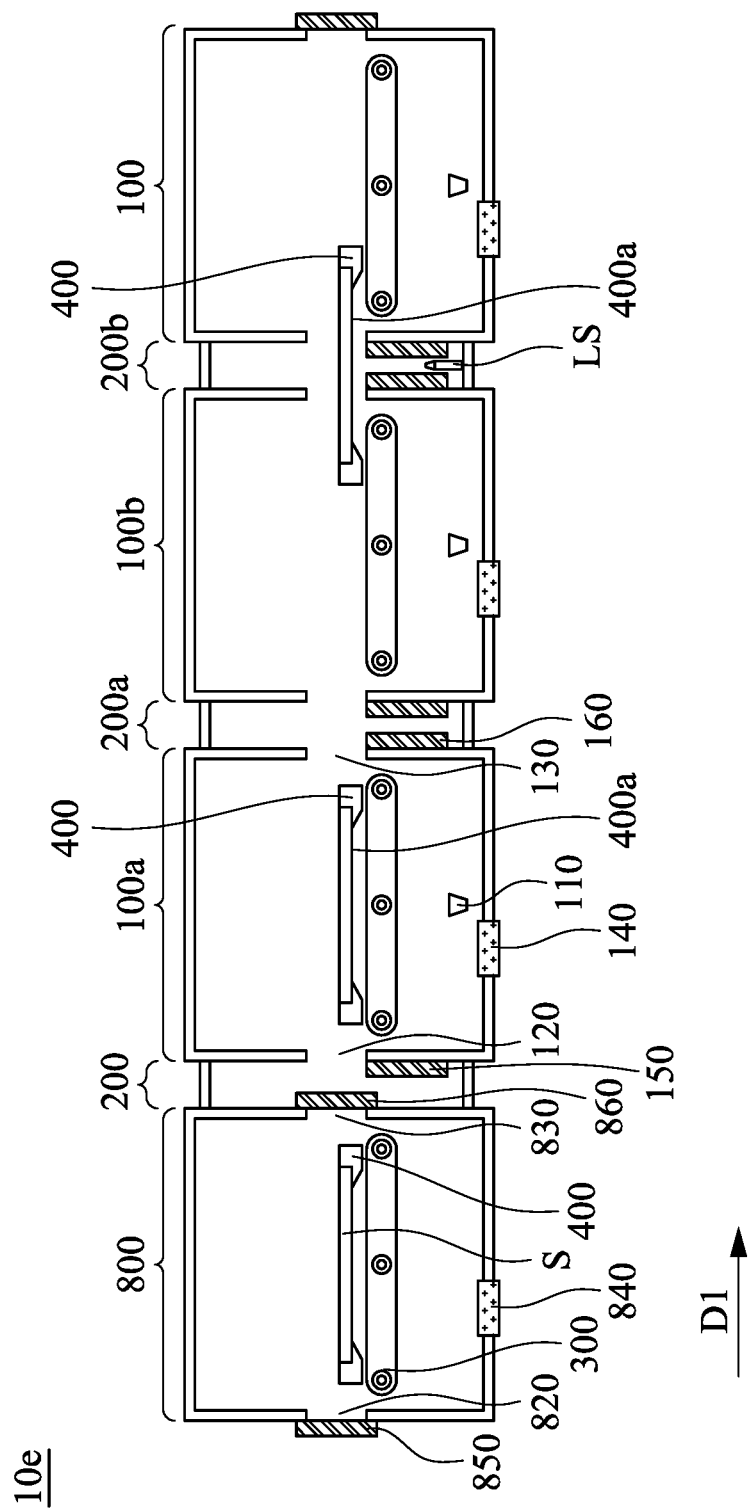
FIG. 7 is a schematic cross-sectional view showing an in-line system for mass production of an organic optoelectronic device according to a sixth embodiment of the present disclosure.

FIG. 7 is a schematic cross-sectional view showing an in-line system 10e for mass production of an organic optoelectronic device according to a sixth embodiment of the present disclosure. Referring to FIG. 7, in the in-line system 10*e* for mass production of an organic optoelectronic device in FIG. 7, the vacuum evaporation chambers comprise a vacuum evaporation chamber 100, a first vacuum evaporation chamber 100*a*, and a second vacuum evaporation chamber 100*b*, and the vacuum channels comprise a vacuum channel 200, a first vacuum channel 200*a*, and a second vacuum channel 200*b*. The in-line system 10*e* for mass production of an organic optoelectronic device in FIG. 7 is similar to that in FIG. 2, and one of the differences is that in the in-line system 10*e* for mass production of an organic optoelectronic device in FIG. 7, a laser source "LS" is disposed in the second vacuum channel 200*b*. Accordingly, in some embodiments, when the substrate "S" is transported from the second vacuum evaporation chamber 100*b* to the vacuum evaporation chamber 100, the laser source "LS" in the second vacuum channel 200*b* will emit a laser to penetrate a layer or a plurality of layers of material on the substrate "S".

Figure 8:
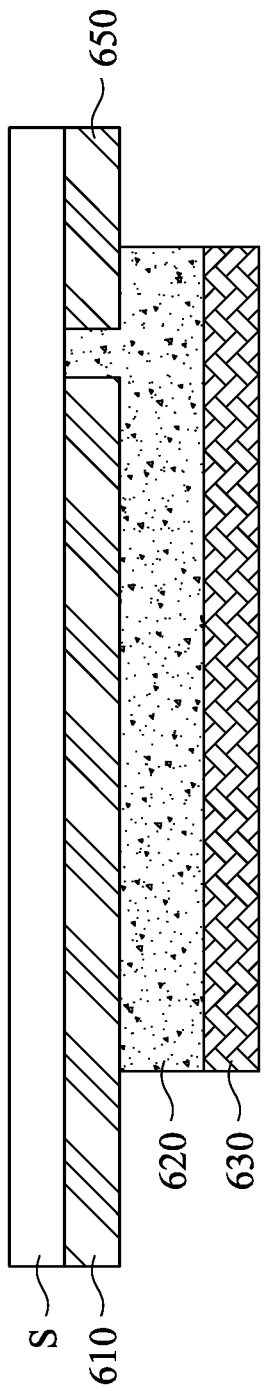
FIG. 8 and FIG. 9 are schematic cross-sectional views of a light-emitting device during various stages of manufacturing thereof according to an embodiment of the present disclosure.
Figure 9:
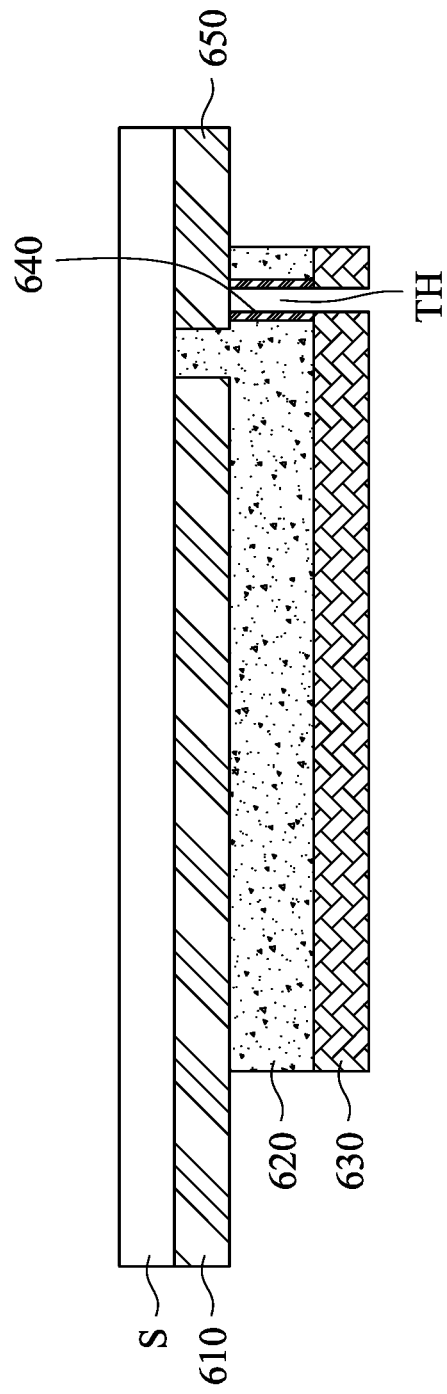

The present disclosure also provides a method for manufacturing a light-emitting device. FIG. 8 and FIG. 9 are schematic cross-sectional views of a light-emitting device during various stages of manufacturing according to an embodiment of the present disclosure.

In various embodiments, the method for manufacturing the light-emitting device comprises operations of (i) providing a substrate "S" with a first electrode layer 610 and a contact electrode layer 650 disposed thereon; (ii) sequentially forming an organic layer 620 and a second electrode layer 630 on the substrate "S" (as shown in FIG. 8); and (iii) using a laser to penetrate the second electrode layer 630 and the organic layer 620 thereunder to create a through hole "TH" penetrating the organic layer 620 and the second electrode layer 630 (as shown in FIG. 9).

Specifically, operations (ii) and (iii) can be carried out by any of the aforementioned in-line systems 10*b*, 10*c*, 10*d* or 10*e* for mass production of an organic optoelectronic device. For example, the in-line system 10*b* for mass production of an organic optoelectronic device as shown in FIG. 4 can be used to sequentially form the organic layer 620 and the second electrode layer 630 on the substrate "S" in a plurality of the vacuum evaporation chambers 100. Next, in the laser processing chamber 500, a laser is used to penetrate the second electrode layer 630 and the organic layer 620 thereunder to create a through hole "TH" penetrating the organic layer 620 and the second electrode layer 630.

Alternatively, referring to FIG. 7, the in-line system 10*e* for mass production of the present invention may comprise a first chamber 100*a*, a second chamber 100*b* and a patterned holder 400. A substrate "S" is carried by the patterned holder 400.

Referring to FIG. 9, the substrate S is covered by the first electrode layer 610 and the contact electrode layer 650. The first electrode layer 610 (see FIG. 9) and the contact electrode layer 650 may be partially shielded by the patterned holder 400 (see FIG. 7).

Referring back to FIG. 7, the first chamber 100*a* is for forming the organic layer 620 on portions of the first electrode layer 610 (FIG. 9) and the contact electrode layer 650 that are not shielded by the patterned holder 400. The second chamber 100*b* (see FIG. 7), which is aligned with the first chamber 100*a*, is for forming the second electrode layer 630 on the organic layer 620 (see FIG. 9).

Still referring to FIG. 7, in an embodiment, the patterned holder 400 comprises an opening 400*a* exposing a portion of the substrate "S", and the second electrode layer 630 (see FIG. 9) and the organic layer 620 formed on the substrate "S" have an identical shape corresponding to the shape of the opening 400*a*. Specifically, a portion of the lower surface of the substrate "S" is shielded by the patterned holder 400 which serves as a mask, while another portion of the lower surface of the substrate "S" is exposed from the opening 400*a*.

In some embodiments, the first chamber 100*a* may be a first vacuum evaporation chamber, while the second chamber 100*b* may be a second vacuum evaporation chamber. Therefore, in the present invention, the organic layer and the second electrode layer can be formed in the in-line vacuum equipment, thereby preventing external contamination and increasing the mass production speed and product quality.

When the second electrode layer 630 (see FIG. 9) and/or the organic layer 620 is formed, the patterned holder 400 (see FIG. 7) may serve as a mask, such that the first electrode layer 610 and the contact electrode layer 650 are partially shielded by the patterned holder 400. Therefore, it is not necessary to replace with other masks, and it is not necessary to use a robot arm for mask replacement, which can effectively reduce the number of masks used and the number of times that mask positioning must be performed. As a consequence, the required process time is greatly reduced and the contamination that may be caused by mask replacement can be prevented, thereby increasing the yield and speed of mass production.

Referring again to FIG. 7, the in-line system for mass production of the present invention may further comprise a first vacuum channel 200*a*. After the organic layer 620 (see FIG. 9) is formed, the substrate 400 (see FIG. 7) can be transported from the first chamber 100*a* to the second chamber 100*b* through the first vacuum channel 200*a* for forming the second electrode layer 630 (see FIG. 9).

Still referring to FIG. 7, the in-line system for mass production of the present invention may further comprise a second vacuum channel 200*b*. A laser source "LS" may be disposed in the second vacuum channel 200*b* to form an electrical connector 640 (see FIG. 9) electrically connecting the second electrode layer 630 to the contact electrode layer 650. In the second vacuum channel 200*b* (see FIG. 7), the electrical connector 640 (see FIG. 9) is formed. Hence, in the present invention, the organic layer, the second electrode layer and the electrical connector can be formed in the in-line vacuum equipment, thereby preventing external contamination and increasing the mass production speed and product quality.

Alternatively, referring to FIG. 6, the in-line system 10*d* for mass production of the present invention may comprise the third chamber 100*c* aligned with the second chamber 100*b*. The laser source "LS" may be disposed above or under a transport unit 300*c* in the third chamber 100*c*. The laser source "LS" may be configured to form an electrical connector 640 (see FIG. 9) electrically and vertically connecting the second electrode layer 630 to the contact electrode layer 650. The third chamber 100*c* (FIG. 6) may be a third vacuum evaporation chamber. The organic layer 620 may be formed by the first evaporation source 112. The second electrode layer 630 may be formed by the second evaporation source 113. In the third evaporation chamber 100*c*, the laser emitted from the laser source "LS" may be applied to penetrate the second electrode layer 630 and the organic layer 620 to create a through hole "TH" penetrating the organic layer 620 and the second electrode layer 630, and to simultaneously form an electrical connector 640 (see FIG. 9) electrically and vertically connecting the second electrode layer 630 with the contact electrode layer 650. The second electrode layer 630 may be penetrated by being partially fused by the laser source "LS". The electrical connector 640 may be made of, for example, but not limited to the fused portion of the fused second electrode layer 630.

Yet another aspect of the present disclosure provides a method for manufacturing an organic optoelectronic device. The method includes transporting a substrate "S" covered with a first electrode layer 610 (see FIG. 9) and a contact electrode layer 650; using a first chamber of the aforementioned in-line system to form an organic layer 620 on the first electrode layer 610 and the contact electrode layer 650; and using a second chamber of the aforementioned in-line system to form a second electrode layer 630 on the organic layer 620. The manufacturing method of the present invention may further comprise forming an electrical connector 640 on the sidewall of a through hole "TH". The electrical connector 640 is electrically connected to the second electrode layer 630 and the contact electrode layer 650.

The through hole "TH" may be formed by, for example, in the vacuum channel 200b provided with a laser source "LS" (see FIG. 7), using a laser to penetrate the second electrode layer 630 and the organic layer 620 thereunder to create a through hole "TH" penetrating the organic layer 620 and the second electrode layer 630. In some embodiments, after penetrating the second electrode layer 630 and the organic layer 620 by the laser, the electrical connector 640 may be formed on sidewalls of the through hole "TH".

According to embodiments of the invention, the organic layer, the second electrode layer and the electrical connector can be formed in the in-line vacuum equipment, thereby preventing external contamination and increasing the mass production speed and product quality. In addition, in the in-line system for mass production according to embodiments of the present invention, when the second electrode layer or the organic layer is formed, the patterned holder itself can serve either as a holder or a mask, such that the first electrode layer and the contact electrode layer are partially shielded by the patterned holder. Therefore, it is not necessary to replace with other masks. Hence, the required process time is greatly reduced and the contamination that may be caused by mask replacement can be prevented, thereby increasing the yield and speed of mass production. In addition, when an electrical connector is formed on a first substrate, a second electrode layer may be simultaneously formed on a second substrate, and an organic layer may be simultaneously formed on a third substrate, such that the mass production speed may be increased. Moreover, it is not necessary to use a robot arm for mask replacement in the present invention, thereby effectively reducing the number of masks used and the number of positioning processes that need to be performed.

In other words, since each vacuum evaporation chamber, laser processing chamber and other processing chambers in the in-line system for mass production of an organic optoelectronic device disclosed herein are in communication with each other, a plurality of substrates can be simultaneously transported by the transport unit. Processes such as deposition and laser may be performed in each chamber, such that the manufacturing hours of the light-emitting device can be reduced. In addition, compared to the conventional cluster deposition apparatus, a patterned holder may serve as a mask in the in-line system for mass production of an organic optoelectronic device disclosed herein. The mask pattern is applicable for each vacuum evaporation chamber, thereby effectively reducing the time to replace the mask and perform positioning.

While the disclosure has been disclosed above in the embodiments, other embodiments are possible. Therefore, the spirit and scope of the claims are not limited to the description contained in the embodiments herein.

It is apparent to those skilled in the art that various changes and modifications may be made without departing from the spirit and scope of the disclosure, and the scope of the disclosure is to be determined by the scope of the appended claims.

What is claimed is:

1. An in-line system for mass production of an organic optoelectronic device, comprising:
    a patterned holder for holding a substrate, wherein the substrate is covered with a first electrode layer and a contact electrode layer, and wherein the first electrode layer and the contact electrode layer are partially shielded with the patterned holder;
    a first chamber for forming an organic layer on the first electrode layer and the contact electrode layer which are not shielded with the patterned holder; and
    a second chamber, aligned with the first chamber, and configured for forming a second electrode layer on the organic layer.

2. The in-line system for mass production of an organic optoelectronic device according to claim 1, wherein the first chamber is a first vacuum evaporation chamber.

3. The in-line system for mass production of an organic optoelectronic device according to claim 1, wherein the second chamber is a second vacuum evaporation chamber.

4. The in-line system for mass production of an organic optoelectronic device according to claim 1, wherein the patterned holder serves as a mask for partially shielding the first electrode layer and the contact electrode layer when the second electrode layer or the organic layer is formed.

5. The in-line system for mass production of an organic optoelectronic device according to claim 1, further comprising a first vacuum channel, wherein the substrate is transported from the first chamber to the second chamber through the first vacuum channel in a direction, to form the second electrode layer, after the organic layer is formed.

6. The in-line system for mass production of an organic optoelectronic device according to claim 1, further comprising a second vacuum channel and a laser source in the second vacuum channel, wherein the laser source is for forming an electrical connector electrically connecting the second electrode layer to the contact electrode layer.

7. The in-line system for mass production of an organic optoelectronic device according to claim 1, further comprising a third chamber aligned with the second chamber wherein the third chamber has a laser source disposed therein, and the third chamber is for forming an electrical connector electrically connecting the second electrode layer to the contact electrode layer.

8. The in-line system for mass production of an organic optoelectronic device according to claim 7, wherein the third chamber is a third vacuum evaporation chamber.

9. The in-line system for mass production of an organic optoelectronic device according to claim 1, further comprising a transport unit for transporting the substrate from the first chamber to the second chamber.

10. The in-line system for mass production of an organic optoelectronic device according to claim 5, wherein a length of the first vacuum channel is less than a length of the patterned holder along the direction.

11. The in-line system for mass production of an organic optoelectronic device according to claim 10, wherein a length ratio of the first vacuum channel to the patterned holder ranges from 1:2 to 1:4 in the direction.

12. The in-line system for mass production of an organic optoelectronic device according to claim 1, wherein the patterned holder comprises an opening exposing a portion of the substrate, and the organic layer and the second electrode layer have an identical shape corresponding to a shape of the opening.

13. The in-line system for mass production of an organic optoelectronic device according to claim 1, wherein the first chamber and the second chamber each comprises a pumping component for vacuumizing the first chamber and the second chamber.

14. The in-line system for mass production of an organic optoelectronic device according to claim 1, wherein the first chamber and the second chamber each comprises an inlet gate and an outlet gate configured to be closed when the first chamber and the second chamber is being vacuumized.

15. The in-line system for mass production of an organic optoelectronic device according to claim 1, wherein the first chamber and the second chamber each comprises a control unit configured to control a duration of transporting the substrate.

16. The in-line system for mass production of an organic optoelectronic device according to claim 1, further comprising a loading chamber coupled to the first chamber, wherein the loading chamber has an outlet connected with the inlet of the first chamber, and the loading chamber is not in communication with the first chamber when the substrate is being loaded into the loading chamber.

17. The in-line system for mass production of an organic optoelectronic device according to claim 1, further comprising a buffer chamber disposed between the loading chamber and the first chamber, wherein the buffer chamber, the loading chamber and the first chamber are not in communication with each other when the buffer chamber is being vacuumized.

18. The in-line system for mass production of an organic optoelectronic device according to claim 1, further comprising a laser processing chamber for forming a through hole penetrating the organic layer and the second electrode layer.

19. A method for producing an organic optoelectronic device by using the in-line system of claim 1, the method comprising:
transporting the substrate covered with the first electrode layer and the contact electrode layer;
using the first chamber to form the organic layer on the first electrode layer and the contact electrode layer; and
using the second chamber to form the second electrode layer on the organic layer.

20. The method for producing the organic optoelectronic device according to claim 19, further comprising a step of forming an electrical connector, wherein the electrical connector is for electrically connecting the second electrode layer to the contact electrode layer.

* * * * *